United States Patent
Wang et al.

(10) Patent No.: US 12,327,748 B2
(45) Date of Patent: Jun. 10, 2025

(54) SEMICONDUCTOR PROCESSING APPARATUS AND METHOD

(71) Applicant: Piotech Inc., Shenyang (CN)

(72) Inventors: Zhuo Wang, Shenyang (CN); Saiqian Zhang, Shenyang (CN)

(73) Assignee: Piotech Inc., Shenyang (CN)

( * ) Notice: Subject to any disclaimer, the term of this patent is extended or adjusted under 35 U.S.C. 154(b) by 820 days.

(21) Appl. No.: 17/520,052

(22) Filed: Nov. 5, 2021

(65) Prior Publication Data

US 2022/0208590 A1 Jun. 30, 2022

(30) Foreign Application Priority Data

Dec. 31, 2020 (CN) .......................... 202011642968.6

(51) Int. Cl.
*H01L 21/683* (2006.01)
*H01J 37/32* (2006.01)

(52) U.S. Cl.
CPC .... *H01L 21/6833* (2013.01); *H01J 37/32183* (2013.01); *H01J 37/32568* (2013.01); *H01J 37/32715* (2013.01); *H01J 2237/2007* (2013.01); *H01J 2237/3321* (2013.01)

(58) Field of Classification Search
None
See application file for complete search history.

(56) References Cited

U.S. PATENT DOCUMENTS

| | | | | | |
|---|---|---|---|---|---|
| 3,226,643 | A | * | 12/1965 | McNair | G08C 15/04 375/216 |
| 3,517,120 | A | * | 6/1970 | Bunting | H04N 7/183 340/286.07 |
| 4,122,415 | A | * | 10/1978 | Luther, Jr. | H03C 1/02 332/155 |
| 4,776,036 | A | * | 10/1988 | Hulsey | H03C 1/16 332/110 |
| 5,350,479 | A | * | 9/1994 | Collins | H01L 21/6831 279/128 |
| 5,491,603 | A | * | 2/1996 | Birang | H01L 21/6833 361/234 |
| 5,535,507 | A | * | 7/1996 | Barnes | H01L 21/6833 361/234 |
| 5,748,434 | A | * | 5/1998 | Rossman | H01L 21/6833 361/234 |

(Continued)

FOREIGN PATENT DOCUMENTS

| TW | 498436 B | 8/2002 |
|---|---|---|
| TW | I333229 B | 11/2010 |

OTHER PUBLICATIONS

First Office Action issued Mar. 14, 2022 in counterpart Taiwan Application No. 110135912.

*Primary Examiner* — Jethro M. Pence
(74) *Attorney, Agent, or Firm* — Blank Rome LLP

(57) ABSTRACT

This application relates to a semiconductor processing apparatus and method. In an embodiment of this application, the semiconductor processing apparatus includes: a wafer pocket provided with a lower electrode, where the lower electrode is coupled to a direct-current power supply; and an upper electrode disposed opposite to the wafer pocket, where the upper electrode is coupled to a radio frequency generator through a matching circuit, and is grounded through a low-pass filter.

4 Claims, 3 Drawing Sheets

(56) References Cited

U.S. PATENT DOCUMENTS

| | | | | |
|---|---|---|---|---|
| 5,761,023 A * | 6/1998 | Lue | ................ | G03F 7/70708 |
| | | | | 361/233 |
| 5,790,365 A * | 8/1998 | Shel | ................ | H01L 21/6833 |
| | | | | 279/128 |
| 5,900,062 A * | 5/1999 | Loewenhardt | ...... | H01L 21/6831 |
| | | | | 307/130 |
| 5,916,689 A * | 6/1999 | Collins | ............... | H01L 21/6831 |
| | | | | 428/307.3 |
| 6,136,386 A * | 10/2000 | Nakahigashi | ......... | C23C 16/507 |
| | | | | 427/904 |
| 6,465,057 B1 * | 10/2002 | Nakahigashi | ......... | C23C 16/345 |
| | | | | 427/535 |
| 6,564,744 B2 * | 5/2003 | Nakahigashi | ........... | C23C 16/34 |
| | | | | 118/723 E |
| 6,830,650 B2 * | 12/2004 | Roche | ............... | H01J 37/32935 |
| | | | | 118/712 |
| 7,192,505 B2 * | 3/2007 | Roche | ............... | H01J 37/32935 |
| | | | | 118/712 |
| 7,993,489 B2 * | 8/2011 | Matsumoto | ....... | H01L 21/67069 |
| | | | | 315/111.21 |
| 8,070,911 B2 * | 12/2011 | Himori | ............. | H01J 37/32082 |
| | | | | 156/345.44 |
| 8,431,035 B2 * | 4/2013 | Iwata | ................ | H01J 37/32183 |
| | | | | 156/345.43 |
| 8,852,385 B2 * | 10/2014 | Koshiishi | .......... | H01J 37/32091 |
| | | | | 156/345.44 |
| 9,038,566 B2 * | 5/2015 | Himori | ............. | H01J 37/32082 |
| | | | | 118/723 E |
| 9,412,562 B2 * | 8/2016 | Himori | ............. | H01J 37/32082 |
| 9,591,739 B2 * | 3/2017 | Bhutta | ................. | H04B 10/50 |
| 9,593,421 B2 * | 3/2017 | Baek | ................. | H01J 37/3255 |
| 9,805,919 B1 * | 10/2017 | Hanks | ............. | H01J 37/32165 |
| 9,824,941 B2 * | 11/2017 | Sakiyama | ............... | C23C 16/50 |
| 9,892,888 B2 * | 2/2018 | Baek | ................ | H01J 37/32091 |
| 9,997,422 B2 * | 6/2018 | Karim | ............... | H01J 37/32137 |
| 10,109,478 B2 * | 10/2018 | Swaminathan | ... | H01L 21/02348 |
| 10,121,708 B2 * | 11/2018 | Sakiyama | ............... | C23C 16/50 |
| 10,128,160 B2 * | 11/2018 | Sakiyama | ........ | C23C 16/45565 |
| 10,229,815 B2 * | 3/2019 | Koshiishi | .......... | H01J 37/32137 |
| 10,504,697 B2 * | 12/2019 | Baek | ................. | C23C 16/4401 |
| 10,510,625 B2 * | 12/2019 | Sakiyama | ............ | C23C 16/4585 |
| 10,529,557 B2 * | 1/2020 | Swaminathan | ........ | C23C 16/505 |
| 10,861,678 B2 * | 12/2020 | Koshiishi | ........... | H01J 37/32091 |
| 11,081,318 B2 * | 8/2021 | Ohno | .................... | C23C 16/505 |
| 11,393,729 B2 * | 7/2022 | Sakiyama | ......... | H01L 21/67069 |
| 11,398,371 B2 * | 7/2022 | Kofuji | ................. | H01L 21/6833 |
| 11,424,105 B2 * | 8/2022 | Mori | ........................ | H05H 1/46 |
| 11,501,976 B2 * | 11/2022 | Watanabe | ......... | H01J 37/32146 |
| 11,694,876 B2 * | 7/2023 | Rogers | ............. | H01J 37/32706 |
| | | | | 438/714 |
| 11,978,612 B2 * | 5/2024 | Mori | ................. | H01J 37/32577 |
| 2001/0017190 A1 | 8/2001 | Nakaune et al. | | |
| 2005/0039852 A1 * | 2/2005 | Roche | ............. | H01J 37/32935 |
| | | | | 156/345.24 |
| 2006/0000803 A1 | 1/2006 | Koshiishi et al. | | |
| 2006/0037704 A1 * | 2/2006 | Iwata | ................ | H01J 37/32091 |
| | | | | 156/345.48 |
| 2008/0236492 A1 * | 10/2008 | Yamazawa | ........ | H01J 37/32091 |
| | | | | 118/721 I |
| 2017/0170047 A1 * | 6/2017 | Nakamura | ........ | H01L 21/67109 |
| 2023/0170192 A1 * | 6/2023 | Guo | ................... | H01J 37/32091 |
| | | | | 156/345.28 |
| 2023/0298856 A1 * | 9/2023 | Rogers | ............. | H01J 37/32146 |
| | | | | 438/714 |
| 2024/0120182 A1 * | 4/2024 | Kikuchi | ............ | H01J 37/32724 |
| 2024/0194447 A1 * | 6/2024 | Guo | ................. | H01J 37/32128 |
| 2024/0331974 A1 * | 10/2024 | Mori | ................. | H01J 37/32577 |

\* cited by examiner

SEMICONDUCTOR PROCESSING APPARATUS AND METHOD

CROSS-REFERENCE TO RELATED APPLICATIONS

This application claims priority to Chinese Patent Application No. 202011642968.6 filed on Dec. 31, 2020, and all the benefits accruing therefrom under 35 U.S.C. § 119, the contents of which in its entirety are herein incorporated by reference.

BACKGROUND OF THE INVENTION

1. Field of the Invention

This application generally relates to the field of semiconductor manufacturing apparatuses, and more specifically, to a semiconductor processing apparatus and method.

2. Description of the Related Art

A semiconductor processing apparatus generally includes an electrostatic chuck. The electrostatic chuck is an ultra-clean wafer carrier applicable to vacuum and plasma operating conditions, and is used for clamping a wafer in a smooth and uniform manner by using an electrostatic adsorption principle. In a semiconductor manufacturing process, the electrostatic chuck is often used for maintaining the temperature and warpage of the wafer, and is a core component of semiconductor processing apparatuses such as a plasma-enhanced chemical vapor deposition apparatus and an ion implantation apparatus.

For a unipolar electrostatic chuck, during absorption and release, a direct current needs to pass through a direct-current power supply, a surface of a wafer pocket, plasma, and a ground to form a direct current loop. However, because a material commonly used for side walls of a process chamber in contact with the plasma is ceramic, which is adverse to free conduction of charges in the plasma, and thus a stable and effective direct current channel from the plasma to the ground cannot be provided. Moreover, an upper electrode in contact with the plasma is usually used as an electrode to which radio frequency is applied, and is coupled with a matching circuit. Because capacitance isolation exists between the upper electrode and the ground, a current in the direct current loop is blocked, which affects stability of the direct current, thus affecting an electrostatic absorption and release effect. The electrostatic absorption and release effect of the electrostatic chuck further affects process stability and production efficiency of the semiconductor processing apparatus.

SUMMARY OF THE INVENTION

Solutions of this application can provide an effective direct current loop to an electrostatic chuck in a semiconductor processing apparatus, to enhance stability of a direct current, improve electrostatic absorption and release functions, and improve process stability and production efficiency of the semiconductor processing apparatus.

In an aspect, this application provides a semiconductor processing apparatus, including: a wafer pocket provided with a lower electrode, where the lower electrode is coupled to a direct-current power supply; and an upper electrode disposed opposite to the wafer pocket, where the upper electrode is coupled to a radio frequency generator through a matching circuit, and is grounded through a low-pass filter.

According to an embodiment of this application, the low-pass filter may include a resistor and an inductor.

According to an embodiment of this application, a resistance value of the resistor is fixed or adjustable.

According to an embodiment of this application, the resistance value or a resistance value range of the resistor is selected based on requirements of a leakage current on a surface of the wafer pocket.

According to an embodiment of this application, the low-pass filter may be connected to a radio frequency feed conductor between the upper electrode and the matching circuit.

According to an embodiment of this application, the low-pass filter may be grounded through a shielding cover plate.

According to an embodiment of this application, the low-pass filter may be disposed in the matching circuit.

According to an embodiment of this application, the low-pass filter may include a direct-current leakage current channel in the matching circuit.

According to an embodiment of this application, the low-pass filter may include a metal-doped ceramic chip capacitor in the matching circuit.

According to an embodiment of this application, the wafer pocket may be made of an insulating material.

According to an embodiment of this application, the wafer pocket includes a J-R type electrostatic chuck.

According to an embodiment of this application, the semiconductor processing apparatus may include a plasma-enhanced chemical vapor deposition apparatus.

In another aspect, this application further provides a method of using the semiconductor processing apparatus described in any embodiment of this application, including: placing a wafer on the wafer pocket; and applying a voltage to the lower electrode in the wafer pocket by the direct-current power supply, to absorb the wafer on a surface of the wafer pocket.

According to an embodiment of this application, the method may further include: applying, during a period in which the voltage is applied to the lower electrode, a radio frequency power to the upper electrode by the radio frequency generator, to generate plasma between the upper electrode and the wafer.

According to an embodiment of this application, the method may further include: stopping applying the voltage to the lower electrode, to release the wafer from the surface of the wafer pocket.

According to an embodiment of this application, the method may further include: applying, during a period in which no voltage is applied to the lower electrode, a radio frequency power to the upper electrode by the radio frequency generator, to generate plasma between the upper electrode and the wafer.

Details of one or more examples of this application are set forth in the following drawings and description. Other features, objectives and advantages are apparent according to the description, drawings and claims.

BRIEF DESCRIPTION OF THE DRAWINGS

Disclosure in this specification provides and includes the following figures.

Figure 1:
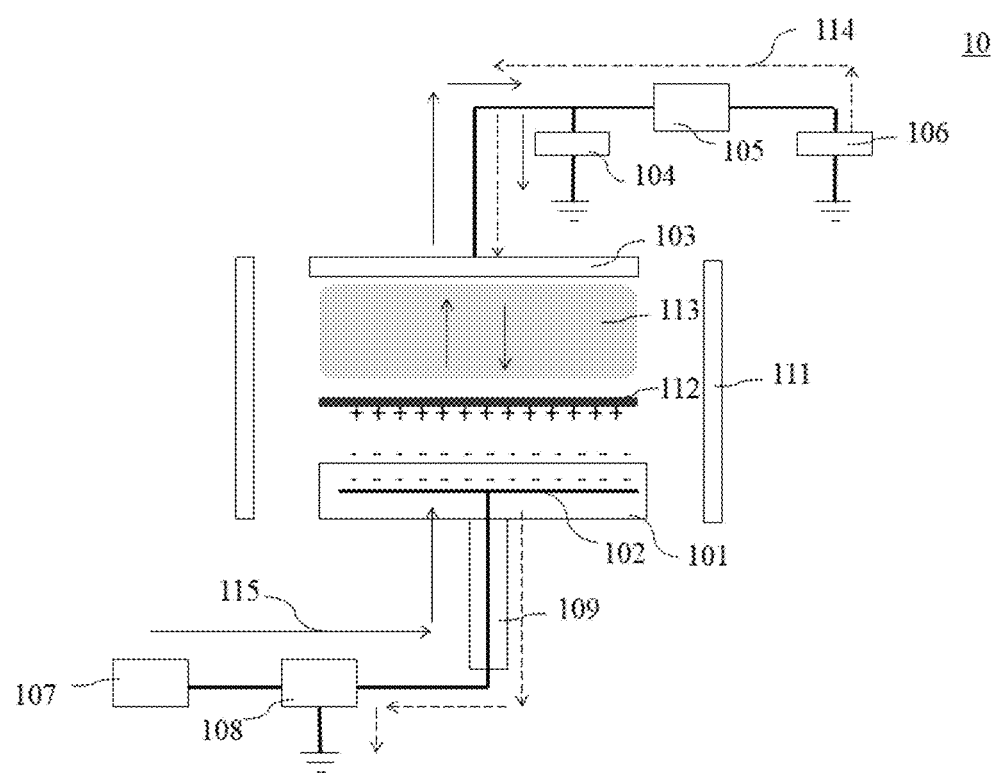
FIG. 1 is a schematic structural diagram of a semiconductor processing apparatus according to some embodiments of this application.

According to conventions, various features illustrated in the drawings may not be drawn to scale. Therefore, for clarity, sizes of the various features may be increased or reduced arbitrarily. Shapes of components illustrated in the figures are only exemplary shapes, and do not limit actual shapes of the components. In addition, for clarity, the embodiments illustrated in the drawings may be simplified. Therefore, the drawings may not illustrate all the components of a given device or apparatus. Finally, the same reference numbers may be used throughout this specification and drawings to indicate the same features.

PREFERRED EMBODIMENT OF THE PRESENT INVENTION

To better understand the spirit of this application, this application is described in detail below with reference to some embodiments of this application.

The term "in an embodiment" or "according to an embodiment" used in this specification does not necessarily refer to the same specific embodiment, and the term "in (some) other embodiments" or "according to (some) other embodiments" used in this specification does not necessarily refer to different specific embodiments. The objective is, for example, that a claimed subject matter may include any combination of all or part of exemplary embodiments. The meaning of "upper" and "lower" herein is not limited to the relationship directly presented by the drawings, but should include descriptions with clear relative relations, for example, "left" and "right," or the opposite of "upper" and "lower." The term "connection" used herein should be construed as including "direct connection" and "connection through one or more intermediate components." The names of the various components used in this specification are only for illustrative purposes, but are not limitative. Different manufacturers may use different names to refer to components with the same function.

Various embodiments of this application are discussed in detail below. Although specific implementations are discussed, it should be understood that the implementations are only for illustrative purposes only. A person skilled in the art knows that other components and configurations may be used without departing from the spirit and the scope of this application. The implementation of this application may not necessarily include all the components or steps in the embodiments described in this specification, or the execution sequence of the steps may be adjusted according to actual applications.

FIG. 1 is a schematic structural diagram of a semiconductor processing apparatus 10 according to some embodiments of this application. In some embodiments, the semiconductor processing apparatus 10 includes a plasma-enhanced chemical vapor deposition apparatus. The semiconductor processing apparatus 10 may include a wafer pocket 101, a lower electrode 102, an upper electrode 103, a low-pass filter 104, a matching circuit 105, a radio frequency generator 106 and a direct-current power supply 107.

The wafer pocket 101 is disposed in a process chamber defined by side walls 111, and is fixed on a supporter 109. The lower electrode 102 is disposed in the wafer pocket 101, and is coupled to the direct-current power supply 107. In some embodiments, a filter 108 is disposed between the direct-current power supply 107 and the lower electrode 102. A direct current may flow to the lower electrode 102 through the filter 108, and a radio frequency current may flow to a ground through the filter 108.

The upper electrode 103 is disposed above the wafer pocket 101 and is opposite to the wafer pocket 101. The upper electrode 103 is coupled to the radio frequency generator 106 through the matching circuit 105. The radio frequency generator 106 may provide a radio frequency power to the upper electrode 103. Process gas in the process chamber generates glow discharge under an action of a radio frequency electric field of the upper electrode 103, to form plasma 113, and is finally deposited on a surface of a wafer 112 placed on the wafer pocket 101 to form a solid film. As shown by the dashed-line arrows in FIG. 1, the radio frequency current may flow from the radio frequency generator 106, and finally flow to the ground through the matching circuit 105, the upper electrode 103, the plasma 113, the wafer 112, the wafer pocket 101, the lower electrode 102 and the filter 108, to form a radio frequency loop 114.

The upper electrode 103 is further grounded through the low-pass filter 104. In some embodiments, the low-pass filter 104 may include elements such as a resistor and an inductor. The direct current may flow to the ground through the low-pass filter 104, and the low-pass filter 104 has high impedance against the radio frequency current.

After the wafer 112 is transferred to the process chamber through a transfer device (not shown) and disposed on the wafer pocket 101, the direct-current power supply 107 may apply a voltage to the lower electrode 102, so that the lower electrode 102 is electrically biased with respect to the wafer pocket 101, and polarized charges (and free charges) are generated on the surface of the wafer pocket 101. The charges accumulated on the surface of the wafer pocket 101 may further affect the wafer 112, so that polarized charges are generated on a surface of the wafer 112. Because a polarity of the charges on the surface of the wafer pocket 101 is opposite to a polarity of charges on a lower surface of the wafer 112, an electrostatic adsorption force is generated between the wafer pocket 101 and the wafer 112, so that the wafer 112 is absorbed to the surface of the wafer pocket 101. In FIG. 1, to show the polarities of the charges on surfaces of the wafer pocket 101 and the wafer 112, the wafer 112 is shown as being spaced apart from the wafer pocket 101. A person skilled in the art should understand that the wafer 112 may be substantially in contact with the wafer pocket 101. As shown by the solid-line arrows in FIG. 1, the direct current may flow from the direct-current power supply 107, and finally flow to the ground through the filter 108, the lower electrode 102, the wafer pocket 101, the wafer 112, the plasma 113, the upper electrode 103 and the low-pass filter 104, to form a direct current loop 115. The direct current loop 115 may provide a stable direct current, thereby improving stability of the electrostatic adsorption and electrostatic force.

It should be noted that, the direct current in the direct current loop 115 is usually in a range of dozens of milliamperes (mA), and the radio frequency current in the radio frequency loop 114 is in a range of several amperes (A) to dozens of amperes (A). Therefore, the direct current has little effect on the plasma and can isolate the radio frequency.

After the direct-current power supply 107 stops applying the voltage to the lower electrode 102, there are residual charges on the surfaces of the wafer pocket 101 and the wafer 112. The residual charges may be led out through the low-pass filter 104, to release the wafer 112 from the surface of the wafer pocket 101. During a period in which no voltage is applied to the lower electrode 102, to form a complete direct current loop to lead out the residual charges, the radio frequency generator 106 may continue to apply the radio frequency power to the upper electrode 103 to generate the plasma 113 between the upper electrode 103 and the wafer 112, but the process gas is removed and deposition is stopped. For example, the radio frequency generator 106 is turned off after the process is completed, and then the radio frequency generator 106 is turned on again, or the radio frequency generator 106 is not turned off after the process is completed. The radio frequency power provided during this period may be lower than that during a normal process, to prevent the plasma at relatively high self-bias from affecting the removal of charges. In a release process, the low-pass filter 104 provides a stable and good direct current loop, thereby improving repeatability and stability of the release.

In some embodiments, the wafer pocket 101 may be a J-R type electrostatic chuck. During a period in which the voltage is applied by the direct-current power supply 107 to the lower electrode 102, polarized charges and free charges are generated on the surface of the wafer pocket 101. Compared with a Coulomb type electrostatic chuck, the J-R type electrostatic chuck has a larger adsorption force (which, for example, may be several orders of magnitude greater than an adsorption force of the Coulomb electrostatic chuck), so that the electrostatic adsorption effect is better.

In some embodiments, the wafer pocket 101 may be made of an insulating material. In some embodiments, the insulating material includes a ceramic material.

In some embodiments, the wafer pocket 101 may further include a heater for performing thermal treatment on the wafer 112.

In some embodiments, the lower electrode 102 is sintered in the wafer pocket 101.

In some embodiments, the radio frequency current generated by the radio frequency generator 106 is a low frequency current, for example, a current with a frequency of 400 kHz. In some embodiments, the radio frequency current generated by the radio frequency generator 106 is a high frequency current, for example, a current with a frequency of 13.56 MHz. In some embodiments, the radio frequency current generated by the radio frequency generator 106 is a current with another frequency. In some embodiments, the radio frequency generator 106 may simultaneously provide both a low frequency current and a high frequency current. The low-pass filter 104 has high impedance against the radio frequency currents.

In some embodiments, the matching circuit 105 may include an inductor and a capacitor. In some embodiments, the matching circuit 105 may include an inductor and two capacitors, where one of the capacitors is grounded. In some embodiments, the matching circuit 105 may include a ceramic chip capacitor.

In some embodiments, a resistance value of a resistor in the low-pass filter 104 is fixed. In some other embodiments, a resistance value of a resistor in the low-pass filter 104 is adjustable, that is, the resistor has a specific resistance value range.

In some embodiments, the resistance value or resistance value range of the resistor in the low-pass filter 104 is selected based on requirements of a leakage current on the surface of the wafer pocket 101, to provide a suitable direct current to control a value and stability of the electrostatic adsorption force. For example, when the temperature of the process chamber is about 400° C., the leakage current on the surface of the wafer pocket 101 is less than 1 mA. Therefore, a current channel of 1 mA level may ensure stable operation of the electrostatic chuck. According to a direct current voltage provided by the direct-current power supply 107 and a current that needs to be provided, a total resistance value required by the direct current loop 115 may be calculated by using a formula R (resistance)=U (voltage)/I (current), and the resistance value of the resistor in the low-pass filter 104 may be estimated. An electrostatic current may be limited by increasing the resistance value of the resistor in the low-pass filter 104.

Figure 2:
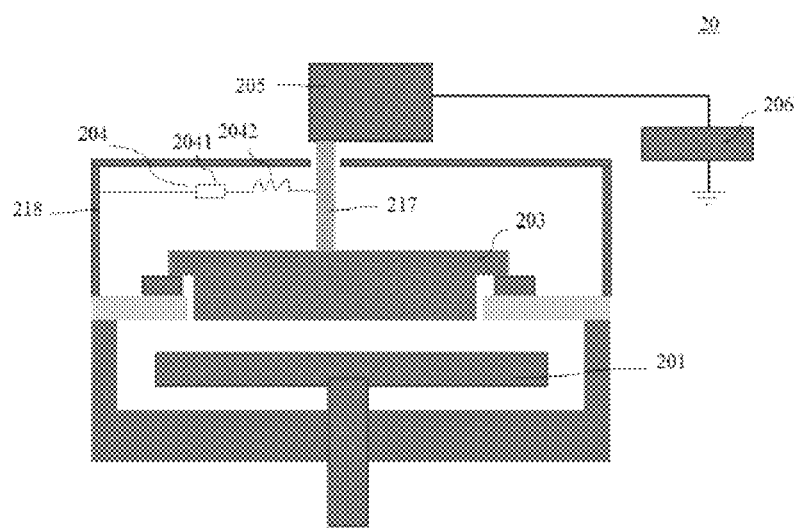
FIG. 2 is a schematic structural diagram of another semiconductor processing apparatus according to some embodiments of this application.

FIG. 2 is a schematic structural diagram of another semiconductor processing apparatus 20 according to some embodiments of this application. The semiconductor processing apparatus 20 may include a radio frequency generator 206, a matching circuit 205, an upper electrode 203 and a wafer pocket 201. As shown in FIG. 2, a shielding cover plate 218 is covered above the upper electrode 203, to provide a ground for the semiconductor processing apparatus 20. The matching circuit 205 is connected to the upper electrode 203 through a radio frequency feed conductor 217, and provides a matched radio frequency signal for the upper electrode 203. In some embodiments, the radio frequency feed conductor 217 includes a copper tape or a copper pillar. The low-pass filter 204 is connected to the radio frequency feed conductor 217, and is grounded through the shielding cover plate 218, thereby providing a stable direct current loop for electrostatic absorption and release. In FIG. 2, the low-pass filter 204 is exemplarily shown as a resistor 2041 and an inductor 2042 connected in series. A person skilled in the art should understand that the low-pass filter 204 may alternatively be implemented in other forms.

Figure 3:
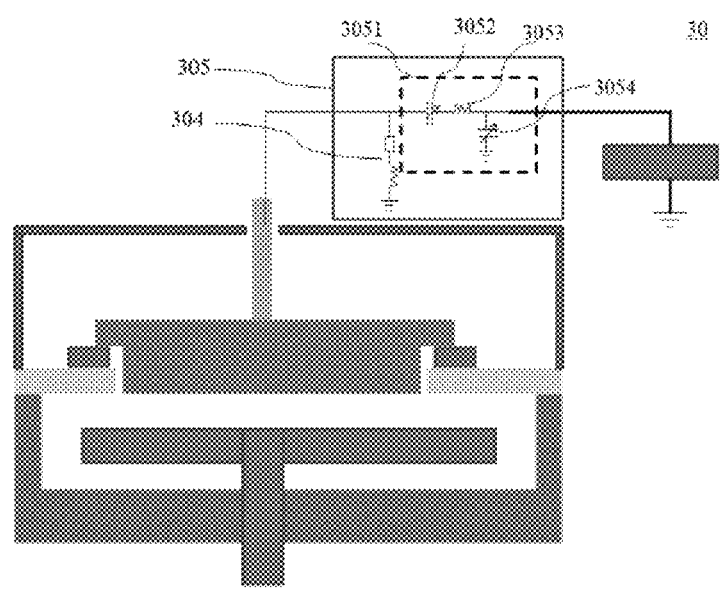
FIG. 3 is a schematic structural diagram of another semiconductor processing apparatus according to some embodiments of this application.

FIG. 3 is a schematic structural diagram of another semiconductor processing apparatus 30 according to some embodiments of this application. A structure of the semiconductor processing apparatus 30 and that of the semiconductor processing apparatus 20 are basically the same, except that a low-pass filter 304 in the semiconductor processing apparatus 30 is disposed in a matching circuit 305. Structures of the low-pass filter 304 and the matching circuit 305 shown in FIG. 3 are only for illustrative purposes, and it should be understood that other circuit structures with similar functions do not depart from the spirit and scope of this application.

In some embodiments, the low-pass filter 304 may be an additional low-pass filter circuit added to the matching circuit 305. As shown in FIG. 3, the low-pass filter 304 may be an additional low-pass filter circuit, which is added outside a matching network 3051, in the matching circuit 305. The matching network 3051 may include a network formed by a capacitor 3052, a capacitor 3054 and an inductor 3053. The low-pass filter circuit may include a resistor and an inductor connected in series. In some other embodiments, the low-pass filter 304 may include a direct-current leakage current channel in the matching circuit 305. For example, a matching network component in the matching circuit 305 may include a ceramic chip capacitor. By doping the ceramic chip capacitor with metal, a milliampere-level leakage current may be formed, thereby forming the direct-current leakage current channel, and providing the direct current loop for electrostatic absorption and release. The milliampere-level leakage current in the matching circuit 305 does not affect radio frequency applications and process performance of the matching circuit.

In some embodiments, a method of using the semiconductor processing apparatus (for example, the semiconductor processing apparatus 10, 20 or 30) of this application may include: placing a wafer on the wafer pocket; and applying a voltage to the lower electrode through the direct-current power supply, so that the wafer is absorbed to the surface of the wafer pocket.

In some embodiments, the method may further include: applying, during a period in which the voltage is applied to the lower electrode, a radio frequency power to the upper electrode by the radio frequency generator, to generate plasma between the upper electrode and the wafer.

In some embodiments, the method may further include: stopping applying the voltage to the lower electrode, to release the wafer from the surface of the wafer pocket.

In some embodiments, the method may further include: applying, during a period in which no voltage is applied to the lower electrode, a radio frequency power to the upper electrode by the radio frequency generator, to generate plasma between the upper electrode and the wafer.

Compared with the existing semiconductor processing apparatus, the semiconductor processing apparatus according to this application may form a stable direct current loop through a grounded low-pass filter, resolving a technical problem that a stable direct current loop cannot be formed in the conventional semiconductor processing apparatus because electric charges cannot be led out from ceramic side walls, thereby increasing stability of the direct current loop in a process chamber, improving electrostatic absorption and release functions, and improving stability and efficiency of a deposition process.

The description herein is provided to enable a person skilled in the art to implement or use this application. Various modifications to this application are readily apparent to a person skilled in the art, and general principles defined herein may be applied to other variations without departing from the spirit or scope of this application. Therefore, this application is not limited to the examples and designs described herein, but is granted the broadest scope consistent with the principles and novel features disclosed herein.

What is claimed is:

1. A semiconductor processing apparatus comprising:
   a wafer pocket comprising a first electrode;
   a direct-current power supply coupled to the first electrode;
   a second electrode opposing the wafer pocket;
   a radio frequency generator; and
   a matching circuit that couples the second electrode and the radio frequency generator, wherein:
   the matching circuit comprises:
      a matching network comprising a ceramic chip capacitor; and
      a low-pass filter disposed in the matching circuit,
   the low-pass filter grounds the second electrode, and
   the low-pass filter is outside the matching network and connected to the ceramic chip capacitor.

2. The semiconductor processing apparatus according to claim 1, wherein the low-pass filter is configured to form a direct-current leakage current channel in the matching circuit via the ceramic chip capacitor.

3. The semiconductor processing apparatus according to claim 2, wherein the ceramic chip capacitor is doped with a metal.

4. The semiconductor processing apparatus according to claim 1, wherein the matching network comprises an inductor connected in series to the ceramic chip capacitor.

* * * * *